United States Patent [19]

Madaffari

[11] Patent Number: 5,083,095
[45] Date of Patent: Jan. 21, 1992

[54] PLURAL SOURCE FOLLOWER AMPLIFIER

[75] Inventor: Peter L. Madaffari, Camden, Me.

[73] Assignee: Knowles Electronics, Inc., Itasca, Ill.

[21] Appl. No.: 570,820

[22] Filed: Aug. 22, 1990

[51] Int. Cl.$^5$ .............................................. H03F 3/16
[52] U.S. Cl. ..................................... 330/277; 330/310
[58] Field of Search ............... 330/149, 150, 277, 297, 330/311, 296, 310

[56] References Cited

U.S. PATENT DOCUMENTS

| | | | |
|---|---|---|---|
| 3,801,933 | 4/1974 | Teare | 330/277 |
| 3,927,383 | 12/1975 | Fjarlie et al. | 330/277 X |
| 4,063,050 | 12/1977 | Carlson et al. | 179/111 E |
| 4,151,480 | 4/1979 | Carlson et al. | 330/277 |

Primary Examiner—Steven Mottola
Attorney, Agent, or Firm—Kinzer, Plyer, Dorn, McEachran & Jambor

[57] ABSTRACT

An amplifier having improved input impedance and reduced susceptibility to power supply ripple, particularly suited for use with a high impedance signal source, utilizes at least two field-effect transistors; the signal source is connected to the gate of the first FET, which is connected to a reference potential by a high resistance, whereas the source electrode of the first FET is connected to the reference potential (usually ground) through a much smaller load resistance and is also connected to the gate of the second FET. The source of the second FET is connected to the drain of the first FET and the drain of the second FET is connected to a power source, usually a low voltage source.

10 Claims, 1 Drawing Sheet

COMMON SOURCE

CASCODE

COMMON DRAIN, JFET CURRENT SOURCE

PLURAL SOURCE FOLLOWER AMPLIFIER

BACKGROUND OF THE INVENTION

In the detection and amplification of low level signals derived from a high impedance source, the first stage of an amplifier may attenuate the incoming signal because of low input impedance or may introduce an input signal component related to the output, causing feedback oscillation. While various techniques have been proposed to circumvent these problems, those techniques are difficult to implement, especially in applications requiring the use of a low supply voltage, such as the single power cell usually used in a hearing aid amplifier. The causes and results of these problems are explained below.

SIGNAL LOSS FROM LOW INPUT IMPEDANCE

An amplifier for a signal from a high source impedance, such as an electret microphone or a capacitor microphone needs a substantially higher input impedance if diminution of the signal is to be avoided. The reason for this is the voltage division that occurs between the signal's source impedance and the input impedance of the amplifier. Representing the source impedance as Zs and the input impedance as Zi, the signal delivered to the amplifier input is reduced from the open signal value, Vs, to the actual value with the completed circuit, Vi, according to the relationship:

$$Vi = Zs \cdot Vs/(Zs+Zi)$$

Thus, if $Zs=Zi$ the signal is decreased by a factor of two, a loss of six dB.

Amplifier stages with good voltage gain frequently do not have high input impedance, and the impedance mismatch at the input can reduce the signal by orders of magnitude. An intermediate stage can be placed between the signal source and the voltage amplifier stage to convert the high source impedance to a much lower impedance without too serious a degradation of the original signal level. One such example occurs when electret-based transducers are employed. For them, the source impedance is represented best as the reactive impedance of a very small capacitance, often less than 10 pfd. At audio frequencies, for example 1000 Hz, the source impedance of 10 pfd is about 16 Megohms; at 1 pf it increases to 160 Megohms. JFET transistors are normally used as they have a high input impedance, which is generally characterized as capacitive; the capacitances are comparable to the electret.

UNWANTED SIGNAL FROM POWER SUPPLY

Another problem associated with high source impedances and complicated by use of a low power supply voltage is a signal introduced via the power supply leads. The immediate source of the problem may be a resistance in the power supply, shared by two or more stages. One typical uncontrolled example is the internal impedance of the power source. This effect is especially troublesome when a power cell nears the end of its life. Unwanted power supply signals can be of various types. Stray pickup of power line hum or of a radio station may occur. The power output stage may contribute a signal that, because of high current drawn through the power supply impedance, is equal to or greater than the wanted signal. The circuit may then go into feedback oscillation. JFETs in general have good immunity to signals on the power supply, as long as the signal is not capacitively coupled to the JFET gate. This coupling is a problem when the JFET is connected to a high source impedance.

SUMMARY OF THE INVENTION

It is a principal object of the invention, therefore, to provide a new and improved amplifier for use with a low voltage power supply and a high impedance input signal source, such as a capacitor or electret microphone, using FET technology, that avoids undue loss of gain but effectively suppresses ripple and other extraneous signals on the power supply.

A more specific object of the invention is to provide a new and improved ripple suppression circuit, usable as a pre-amplifier stage in a hearing aid or in other similar applications, that is small, simple, and inexpensive in construction, yet highly reliable and effective in operation.

According to the invention, therefore, an impedance conversion amplifier that is effective to suppress ripple and other extraneous signals from a power supply comprises first and second field-effect transistors (FETs) each having gate, source, and drain electrodes; input means are provided for applying an input signal to the gate of the first FET, a load resistor is connected from the source of the first FET to a reference potential, and connector means connect the drain and source of the first FET to the source and gate, respectively, of the second FET. The amplifier further comprises means for connecting the drain of the second FET to a low voltage power supply, whereby the first FET affords the functions of impedance conversion and gate bias for the second FET and the second FET provides a relatively constant operating voltage for the first FET, driving the drain of the first FET to near the A.C. potential of its gate.

DETAILED DESCRIPTION

Figure 1:
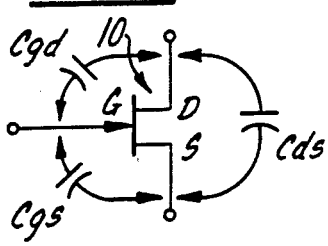
FIG. 1 illustrates an N channel juncture field-effect transistor (JFET) and is employed to explain certain impedance attributes of that device.

In considering JFET circuitry, several terms are preferably defined. First is the transconductance, gm, defined as the ratio of input voltage to output current. A JFET acts like a source of an A.C. current, such that $$Is = gm \, (Vgs), \tag{1}$$

where Vgs is the voltage between the gate terminal G and the source terminal S (FIG. 1). If this current Is flows through a resistor R it produces a voltage, Vr, across that resistor $$Vr = (gm)Vgs(R) \tag{2}$$

Next are the various capacitances between the terminals. An N channel JFET 10, FIG. 1, is structured as a reverse biased diode. Three terminals are involved, as one element is extended as a channel instead of a point contact. There is intrinsic capacitance between the terminals of the device due to the semiconductor properties. The three terminals are the drain G, the source S and the gate G. The three associated capacitances are Cgs, Cgd and Cds, FIG. 1. The resistive component of the impedance between drain D and gate G is much greater than the reactive impedance caused by capacitance Cgd. The same is true of the source and gate pair, but not of the drain and source pair. Therefore, only Cgd and Cgs are normally important. These capacitances are to a degree dependent on the D.C. potential between the terminals, decreasing as the potential increases. When low supply voltages are used this effect is not very important. These capacitances combine to form the input capacitance of the FET 10; that is the input capacitance is a combination of Cgs and Cgd. If the gate, drain, and source are all at the same D.C. potential, the input capacitance Cin is $$Cin = Cgs + Cgd \qquad (3)$$

The input capacitance, however, is also a function of the A.C. potential difference between terminals of the FET. If the A.C. potential on one terminal is related to that at another the effective capacitance is altered by the Miller effect. If Cb is designated as the capacitance between two terminals A and B when A is at a potential Va and the potential at B, Vb, is zero, and the potential Vb is forced to follow VA such that Vb' = [T]Va, then the effective capacitance Cab' between terminals A and B is:

$$Cab' = [1 - T]Cab \qquad (4)$$

Note that if T=0, i.e., the terminal is rounded, the result is Cab. If it is negative, then the capacitance is increased. If T is positive and less than 1, the capacitance is decreased.

As noted before, the input capacitance Cin of device 10, FIG. 1, aside from strays, is:

$$Cin = Cgs + Cgd \qquad (3)$$

if drain D and source S are at the same potential, usually ground. Otherwise Cin', which takes into account Miller effects, must be used where:

$$Cin' = Cgs' + Cgd' \qquad (5)$$

In the case of power supply feedthrough, in a JFET amplifier, a desired signal introduced at the gate of the FET is accompanied by an undesirable signal due to ripple or to any signal induced on the power supply lead. This undesirable signal is applied to the drain, particularly for the common drain configuration (FIG. 4), where the signal on the drain is the same as the one on the power lead. The gate-to-chain capacitance Cgd (see FIG. 1) serves as the source capacitor for this undesirable signal. Now the roles are reversed between source and input impedance and the signal voltage Vg(ps) induced at the gate from the ripple or other powr supply signal, Vps, is $$\begin{aligned} Vg(ps) &= (Vps)Cgd'/(Cs + Cin') \\ &= (Vps)Cgd'/(Cs + Cgs' + Cgd') \end{aligned} \qquad (6)$$

Therefore, to optimize the desired signal and minimize the feedback signal, capacitance Cgd' should be reduced as much as possible.

PRIOR ART—COMMON SOURCE CONFIGURATION —FIG. 2

Figure 2:
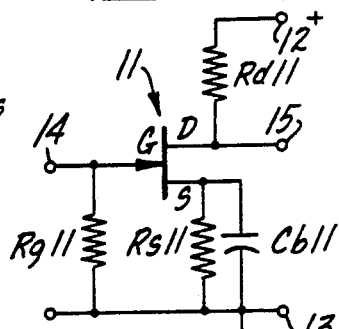
FIGS. 2, 3 and 4 are schematic diagrams of previously known JFET amplifier circuits.

One application of the FET is in the common source configuration shown in FIG. 2 for the JFET 11. The drain D of device 11 is connected to a power supply terminal 12 by a load resistor Rd11 and is also connected directly to an output terminal 15. An input resistor Rg11 is connected from an input terminal 14 to a ground terminal 13; input terminal 14 is also connected to the gate G. The source S may be grounded directly or, as shown, through the parallel combination of a resistor Rs11 and a capacitor Cb11. For a JFET, the parallel input resistance Rg11 is in the gigaohm range. For this device the signal source, such as a microphone, connected to terminal 14 is A.C. grounded and there is a resistor Rd11 between the drain D and power supply terminal 12. This circuit has the advantage of having a good voltage gain, T, of approximately $$T = -gm(Rd) \qquad (7)$$

Unfortunately, however, the input capacitance Cin' is high because the gate-to-source capacitance Cgs (see FIG. 1) is not reduced and Cgd' is increased by the factor $$Cgd' = Cgd[1 + (gm)(Rd)] \qquad (8)$$

due to the Miller effect.

In some instances, particularly for the smaller electret transducers, the signal loss due to capacitive voltage division at the input will more than offset the voltage gain from input 14 to output 15. In addition, the common source configuration, FIG. 2, normally draws high current if the source connected to terminal 14 is also at D.C. ground potential. If it is not, a resistor Rs11 and an additional large bypass capacitor Cb11 are needed, as shown in FIG. 2. For good voltage gain resistor Rd11 must be large. In single cell operation Rd11 is limited by the power supply and the current drawn is often prohibitive.

Furthermore, in the common source circuit of FIG. 2 an undesirable signal on the power terminal supply 12 feeds through the load resistor Rll before reaching the JFET 11 and aqppears directly at the output terminal 15. Therefore, there is no suppression of a direct feedthrough ripple or other extraneous signal. However, the input signal has been amplified while the ripple has not, so that, as referred to the input, some ripple suppression has occurred.

CASCODE CONFIGURATION, FIG. 3

Figure 3:
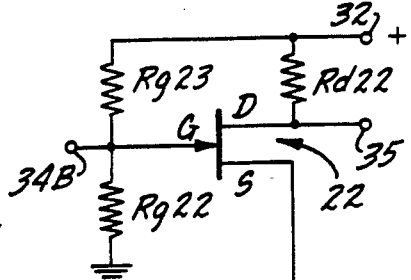

A cascode amplifier is usually defined in bipolar technology terms as a common emitter stage feeding a common base stage. As shown in FIG. 3, using JFET technology the corresponding circuit is a common source stage comprising a JFET 21 feeding a common gate stage including a second JFET 22. A voltage divider comprising resistors Rg23 and Rg22 connects the gate terminal 34B of JFET 22 to ground and to a power supply terminal 32. The drain D of JFET 22 is connected to an output terminal 35 and to a load resistor Rd 22 that connects to power supply terminal 32. The drain of device 21 is connected to the source of device 22.

The source S of the JFET 21 is at ground potential, by connection to a terminal 33. The full zero bias capacitance, Cgs, therefore occurs (see FIG. 1). Also, in the cascode circuit of FIG. 3 the signal on the drain of JFET 21 is opposite in phase to the gate signal applied via terminal 34A and resistor Rg21. In its theoretical limit, this input signal is reduced to zero, i.e., ground potential. Therefore the full value of Cgd appears. In operation, because the signal is not reduced to zero, and because it has opposing phase, the actual capacitance to the gate of JFET 21 is increased. That is:

$$Cgd' \geqq Cgd \qquad (9)$$

This is the real benefit of the cascode circuit FIG. 3; removal of the Miller capacitance while still providing voltage gain. Note that the gain is $-gm(Rd)$, with $$gm(Rd) \geqq 1 \qquad (10)$$

as for the common source stage. However, the second FET 22 isolates the drain of FET 21 from the power lead 32. While there is no feedthrough at the gate of device 22, feedthrough does occur at the load resistor Rd22 because it is directly to the power terminal 32. As with the common source stage, FIG. 2, there is some ripple suppression because of gain in the amplifier.

COMMON DRAIN CONFIGURATION—FIG. 4

To minimize input capacitance, a FET is often used in the common drain configuration, also known as a source follower. This circuit also reduces susceptibility to signals on the power supply rail as the FET is interposed between the positive rail and the load resistor. The common drain circuit configuration for a JFET, FIG. 4, is similar to the common cathode circuit for vacuum tubes and the common collector for bipolar transistors; the voltage gain is slightly less than unity referred to the gate, but an impedance conversion from millions of ohms at the input to thousands at the output is effected.

Figure 4:
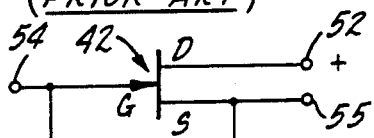

FIG. 4 shows a common drain FET circuit with the usual load resistor replaced by a JFET 41 with grounded gate and a grounded source, both connected to a ground terminal 53. The JFET 41 acts as a current source for an amplifier JFET 42. An input resistor Rg42 is connected between the input terminal 54 and ground terminal 53, with input 54 connected to the gate of JFET 42. The drain of device 42 is connected to a power supply terminal 52; its source is connected to the drain of device 41 and to output terminal 55. Feedthrough suppression for the circuit of FIG. 4 is similar to that of a simple source follower.

FEEDTHROUGH SUPPRESSION FILTER

As noted earlier, a ripple or other extraneous signal may occur on the power rails due to the internal impedance of a power source. The power supply resistance is usually quite low, but because of high current draw the induced signal may be comparable to the input signal to the amplifier. To reduce this ripple signal a capacitor could be placed across the power leads, but the capacitance would be prohibitively large. An alternative is to place a large resistor between the power lead and the stage to be isolated, with a capacitor across the normal leads of that stage. This capacitor is smaller than the one first mentioned, as the resistance of the RC filter is greatly increased by the added resistor. However, the capacitor is still usually quite large and the D.C. voltage drop across the added resistor decreases the available powe supply. A filter of this type could be used with any of the circuits shown.

THE PLURAL SOURCE FOLLOWERS OF THE INVENTION; FIGS 5 AND 6

The source follower of FIG. 4 improves the input capacitance by using feedback to reduce the effective value of Cgs (FIG. 1). If a similar technique can be effective to reduce Cgd, then the input capacitance will be further reduced and, perhaps more importantly, feedthrough to the gate will be reduced.

In a source follower the drain of the amplifier JFET (e.g., device 42 in FIG. 4) is connected to the power supply. However if the drain were to be connected to an active device, the A.C. potential at the drain could be set to approximately that of the gate, thereby reducing the effective capacitance. One technique would be to connect the drain of the amplifier JFET to the source of another JFET having its drain connected to the power lead. The first FET would then act as the load for the second FET. To produce the desired effect, the gate of the second FET must be connected to a low impedance source that is in phase with and of the approximate magnitude of the gate signal. Furthermore the D.C. potential of the gate must be lower than that of the source of the second JFET to insure proper biasing. The source of the first JFET provides just such a signal. Both stages are source followers, hence the name, Double Source Follower (DSF).

Figure 5:
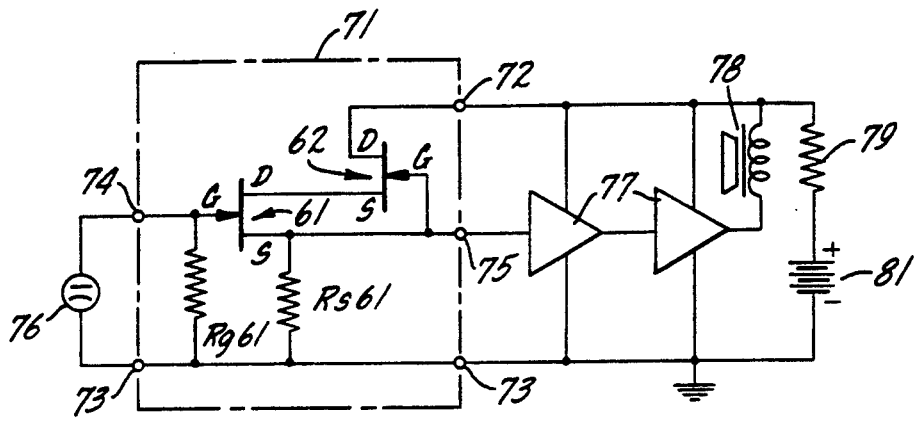
FIG. 5 is a schematic diagram of an amplifier constructed in accordance with one embodiment of the present invention, in a typical application.

FIG. 5 shows such a DSF circuit 71 using two JFETs 61 and 62 in a typical environment, a hearing aid. As shown, an electret microphone 76 is connected across input terminals 73 and 74 in parallel with an input resistor Rg6, the terminal 74 being connected to the gate of the first JFET 61. The source S of device 61 is returned to the round terminal 73 through a resistor Rs61. The drain of JFET 61 is connected to the source S of device 62, whereas the gate G of device 62 is connected to the source of device 61. The output terminal 75 (from the source S of 61) is connected to the first of two further series connected amplifiers 77 which drive a transducer 78. The power supply is a tiny battery 81, usually a single cell, connected between a supply terminal 72 and the ground terminal 73.

As can be seen, device 61 behaves principally as a JFET signal source follower. The second JFET 62 serves to produce the D.C. potential required for operation of JFET 61, and also develops a signal very close to that of the source S of JFET 61, which in turn is close to the A.C. gate potential of JFET 61. JFET 62, therefore, also functions in the source follower mode, using JFET 61 as its load resistor and the signal at the source electrode of JFET 61 for its input. Note that the output impedance of JFET 61 is resistive and is measured in thousands of ohms. At audio frequencies, therefore, the signal at the gate G of device 61 is not attenuated, and feedthrough from the power supply terminal 72 is ineffective.

The signal at the drain of JFET 61 reduces its gate-to-drain capacitance Cgd, which both increases the effective desired signal and also decreases the feedthrough.

The amplifier circuit 71, FIG. 5, will not have as low an output impedance as a simple source follower circuit, due to the feedback to the drain of device 61. In some applications, therefore, a third JFET 63 may be used to decrease the output impedance even more, as shown in amplifier 71A, FIG. 6. The gate of device 63 is connected to the gate of JFET 62, the drain of JFET 63 is connected to power supply terminal 72, and the source of the third JFET is connected to output terminal 75 and to a load resistor Rs63 connected to ground terminal 73. Assuming a reasonable choice for the load resistor Rs61 of JFET 61, the feedthrough capacitive coupling to JFET 63 will still be negligible. Amplifier 71A may be termed a Triple Source Follower (TSF).

Because FETs 62 and 63 have common connections for their gates G and drains D, they can be manufactured as a single FET with two source leads. Two channels are thus established in this device. Indeed, all three of the JFETs 61–63 and the three resistors of circuit 71A may be formed on a common semi-conductor base. Circuit 71A is effective at virtually any supply voltage if the JFETS 61–63 are properly chosen. Like amplifier 71, it is particularly useful in applications of very low supply voltage, such as a single cell. A typical application where a single cell is used is in a hearing aid. When the supply voltage is low, the gate-drain and gate-source potentials are also low. A JFET is a reverse-biased diode; a diode under low bias has a higher capacitance between its elements than it would have under a higher bias. Normally, the source-gate bias is the lower of the two in a JFET, but the common drain circuit 71A reduces the gate-source capacitance. However, the gatedrain capacitance is not normally reduced in the simple circuit and therefore becomes a bigger factor in low supply voltage applications.

Figure 6:
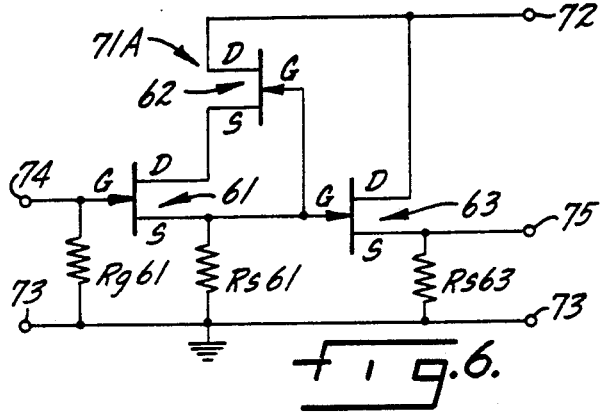
FIG. 6 is a schematic diagram of an amplifier constructed in accordance with another embodiment of the invention.

When used in low voltage applications as described above, JFETs having low pinch off voltages are necessary, but these are available. The circuitry, FIGS. 5 and 6, is D.C. coupled and therefore avoids the use of bulky coupling capacitors. As noted above, ripple suppression is ordinarily achieved by placing a filter resistor between drain and supply and installing a large capacitor from drain to ground, but this expedient reduces the effective power supply. Both the resistor and capacitor are eliminated, yet the full supply voltage is available in the circuits of the invention.

In describing FIGS. 5 and 6, circuits 71 and 71A have been referred to as "amplifiers", and they are in fact amplifier circuits. On the other hand, these circuits serve primarily as impedance conversion circuits; their principal function is to convert a very high impedance source (e.g., an electret microphone or a capacitor microphone) to a much lower impedance level. Usually, the change is from the gigaohm to the kilohm range. Gain, in an "amplifier" of this kind, is of secondary importance. Of course, suppression of ripple or any extraneous signal in the power supply circuit is a primary consideration.

I claim:

1. An impedance conversion amplifier that is effective to suppress ripple and other extraneous signals from a power supply comprising:
   first and second field-effect transistors (FETs) each having gate, source, and drain electrodes;
   input means for applying an A.C. input signal to the gate of the first FET, the input means including a very high impedance input resistor connected from the gate of the first FET to the reference potential;
   a load resistor connecting the source of the first FET to a reference potential;
   connector means connecting the drain and source of the first FET to the source and gate, respectively, of the second FET;
   and means for connecting the drain of the second FET to a low voltage power supply;
   whereby the first FET affords the functions of impedance conversion and gate bias for the second FET and the second FET provides a relatively constant operating voltage for the first FET, driving the drain of the first FET to near the A.C. potential of its gate.

2. An impedance conversion amplifier according to claim 1 in which the input resistor is in the gigaohm range and the load resistor is in the kilohm range.

3. An impedance conversion amplifier according to claim 2 in which the reference potential is ground.

4. An impedance conversion amplifier according to claim 1 in which both FETs are formed on one semiconductor base.

5. An impedance conversion amplifier according to claim 1 and further comprising:
   a third FET having gate, source, and drain electrodes;
   means interconnecting the gate and drain electrodes, respectively, of the second and third FETs;
   and a load resistor connecting the source of the third FET to the reference potential;
   whereby the third FET affords a further impedance reduction for the amplifier.

6. An impedance conversion amplifier according to claim 5 in which the input means includes a very high impedance input resistor connected from the gate of the first FET to the reference potential.

7. An impedance conversion amplifier according to claim 6 in which the input resistor is in the gigaohm range and each of the load resistors is in the kilohm range.

8. An impedance conversion amplifier according to claim 7 in which the reference potential is ground.

9. An impedance conversion amplifier according to claim 5 in which the second and third FETs comprise a single FET having two source electrodes 10. An impedance conversion amplifier according to claim 5 in which all FETs are formed on one semi-conductor base.

* * * * *